United States Patent
Acosta et al.

(10) Patent No.: US 6,720,230 B2
(45) Date of Patent: Apr. 13, 2004

(54) METHOD OF FABRICATING INTEGRATED COIL INDUCTORS FOR IC DEVICES

(75) Inventors: Raul E. Acosta, White Plains, NY (US); Melanie L. Carasso, West Pennant Hills (AU); Steven A. Cordes, Yorktown Heights, NY (US); Robert A. Groves, Highland, NY (US); Jennifer L. Lund, Amawalk, NY (US); Joanna Rosner, Hastings-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 10/238,746

(22) Filed: Sep. 10, 2002

(65) Prior Publication Data

US 2003/0011041 A1 Jan. 16, 2003

Related U.S. Application Data

(62) Division of application No. 09/808,381, filed on Mar. 14, 2001, now Pat. No. 6,492,708.

(51) Int. Cl.[7] .............................................. H01L 21/20
(52) U.S. Cl. ............................ 438/381; 438/3; 438/640
(58) Field of Search ................................. 438/381, 329, 438/238, 210, 3, 622, 638, 639, 640, 641; 336/200

(56) References Cited

U.S. PATENT DOCUMENTS

| | | | |
|---|---|---|---|
| 3,881,244 A | * 5/1975 | Kendall | 29/602.1 |
| 5,372,967 A | 12/1994 | Sundaram et al. | |
| 5,793,272 A | 8/1998 | Burghartz et al. | |
| 5,884,990 A | 3/1999 | Burghartz et al. | |
| 6,008,102 A | * 12/1999 | Alford et al. | 438/381 |
| 6,249,039 B1 | 6/2001 | Harvey et al. | |
| 6,478,975 B1 | * 11/2002 | Ju | 216/6 |
| 2002/0109204 A1 | * 8/2002 | Acosta et al. | 257/531 |
| 2003/0122175 A1 | * 7/2003 | Buskirk | 257/310 |

* cited by examiner

Primary Examiner—Tuan H. Nguyen
(74) Attorney, Agent, or Firm—Scully, Scott, Murphy & Presser; Robert M. Trepp, Esq.

(57) ABSTRACT

A means for fabrication of solenoidal inductors integrated in a semiconductor chip is provided. The solenoidal coil is partially embedded in a deep well etched into the chip substrate. The non-embedded part of the coil is fabricated as part of the BEOL metallization layers. This allows for a large cross-sectional area of the solenoid turns, thus reducing the turn-to-turn capacitive coupling. Because the solenoidal coils of this invention have a large diameter cross-section, the coil can be made with a large inductance value and yet occupy a small area of the chip. The fabrication process includes etching of a deep cavity in the substrate after all the FEOL steps are completed; lining said cavity with a dielectric followed by fabrication of the part of the coil that will be embedded by deposition of a conductive material metal through a mask; deposition of dielectric and planarization of same by CMP. After planarization the fabrication of the remaining part of the solenoidal coil is fabricated as part of the metallization in the BEOL (i.e. as line/vias of the BEOL). To further increase the cross section of the solenoidal coil part of it may be built by electrodeposition through a mask on top of the BEOL layers.

18 Claims, 3 Drawing Sheets

METHOD OF FABRICATING INTEGRATED COIL INDUCTORS FOR IC DEVICES

RELATED APPLICATIONS

This application is a divisional of U.S. application Ser. No. 09/808,381, filed Mar. 14, 2001, now U.S. Pat. No. 6,492,708.

FIELD OF THE INVENTION

The present invention relates to semiconductor devices, and more particularly to a multiturn solenoidal inductor integrated in a semiconductor chip, such as those used for radio frequency (RF) communications. The present invention also relates to a method of fabricating the inventive multiturn solenoidal inductor.

BACKGROUND OF THE INVENTION

Inductors integrated in semiconductor chips are normally fabricated in the shape of spirals in one BEOL (back-end-of-the-line) metallization level (plus vias to connect to and from the return arm). Because of the limited thickness of BEOL metallization layers (on the order of about 2 to about 4 microns), spiral inductors have a relatively high resistance (on the order of about 1–5 ohms or greater) for a given inductance value. Dual metal layers, with interconnecting vias, are sometimes utilized to reduce the spiral resistance. Because the inductance value is directly related to the length of the inductor trace, spiral inductors are limited to fairly small inductance values (on the order of about 20 nHenries or less), and occupy a fairly large area of the chip. Because the electromagnetic field of a spiral inductor is not confined, active devices are typically not allowed under the inductor, and thus spiral inductors occupy a lot of chip real estate.

Integrated solenoidal inductors can also be fabricated in the BEOL layers of a semiconductor chip. These devices have limitations arising from the high capacitive coupling between the solenoidal turns, which arises from the fact that the total thickness of the BEOL layers is very small, on the order of about 8 to about 10 microns, so the solenoidal turns are necessarily in close vertical proximity to each other. This close proximity also limits the cross-sectional area of the solenoid which directly limits the achievable inductance, since solenoidal inductance is directly related to cross-sectional area.

In view of the above drawbacks in the prior art, there is a continued need for developing a multiturn solenoidal inductor integrated in a semiconductor chip which overcomes the foregoing prior art problems.

SUMMARY OF THE INVENTION

One object of the present invention is to provide a multiturn solenoidal inductor integrated in a semiconductor chip.

A further object of the present invention is to provide a multiturn solenoidal inductor integrated in a semiconductor chip wherein the solenoid turns are sufficiently separate from each other, thereby reducing capacitive coupling between the solenoid turns.

A still further object of the present invention is to provide an integrated structure which contains solenoidal coils having large diameter cross-sections associated therewith.

An even further object of the present invention is to provide an integrated structure which has solenoidal coils having a large inductance value, yet occupy a small area of the chip.

These and other objects and advantages are obtained by providing solenoidal inductors integrated in a semiconductor chip wherein the solenoidal coil is partially embedded in a deep well (i.e., cavity) etched into the semiconductor chip. The term "deep well" as used herein denotes a cavity whose depth from an upper surface of the semiconductor chip is from about 10 to about 50 microns, preferably from about 20 to about 25 microns. This allows for large separation of solenoid turns, and thus reduces the capacitive coupling between the turns. Because the solenoidal coils of the present invention have a large diameter cross-section (on the order of about 25 to about 35 microns), the inventive coils can be made with a large inductance value and yet occupy a small area of the chip.

One aspect of the present invention thus relates to a semiconductor structure which comprises a solenoidal coil integrated with an integrated circuit (IC) chip, wherein said solenoidal coil is partially embedded inside a cavity formed in a substrate of said IC chip and partially in back-end-of-the-line layers of said IC chip.

In one embodiment of the present inventor, the solenoidal coil includes a magnetic core. In another embodiment of the present inventor, the solenoidal coil is in the shape of a toroid.

Another aspect of the present invention relates to an electrical transformer which comprises two solenoidal coils having a common magnetic core.

A still further aspect of the present invention relates to a method of fabricating the above-mentioned semiconductor structure. Specifically, the inventive semiconductor structure is fabricated by the following processing steps that include:

(a) forming one or more cavities in a substrate of an integrated circuit (IC) chip;

(b) forming a first dielectric material over said substrate including in said one or more cavities;

(c) removing said first dielectric material abutting said one or more cavities, while leaving said first dielectric material in said one or more cavities as a liner;

(d) forming a bottom coil element of a solenoidal coil in said one or more dielectric lined cavities;

(e) forming a second dielectric material over said substrate including said bottom coil element of said solenoidal coil;

(f) removing said second dielectric material over said substrate not containing said one or more cavities; and (g) forming side coil elements and a top coil element of said solenoidal coil, wherein said top coil element is in electrical contact with said bottom coil element through said side coil elements.

In one embodiment of the inventive method, side coil elements are formed in step (d), and step (g) only includes formation of a top coil element.

BRIEF DESCRIPTION OF THE DRAWINGS

FIG. 1A shows a cross-section (not to scale) of an integrated circuit (IC) wafer with a toroidal coil partially embedded in the substrate; whereas

DETAILED DESCRIPTION OF THE INVENTION

Figure 1A:
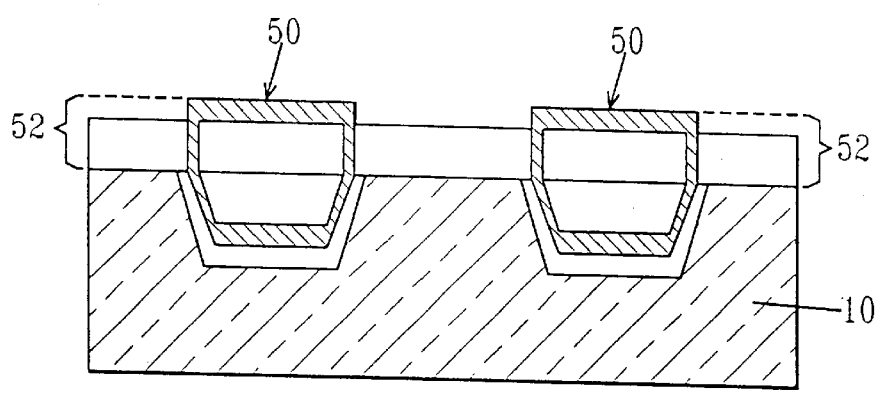

The present invention, which provides a multiturn solenoidal inductor integrated in a semiconductor chip and a method of fabricating the same, will now be described in more detail by referring to the drawings that accompany the present application. It should be noted that in the accompanying drawings, like and/or corresponding elements are referred to by like reference numerals.

Reference is first made to FIGS. 1A (cross-sectional view) and 1B (top view) which illustrate the inventive semiconductor structure. Specifically, FIG. 1A comprises a structure that includes substrate 10 having one or more solenoidal coils 50 formed inside cavities that are formed in the substrate and partially in BEOL wiring levels 52. A top view of solenoidal coils 50 of FIG. 1A is shown, for example, in FIG. 1B.

In accordance with the present invention, each solenoidal coil 50 includes bottom coil element 22 and top coil element 30 that are in electrical contact with each through side coil elements 26. First dielectric layer 12 is formed between bottom coil element 22 and substrate 10 and second dielectric layer 24 is formed in between the top and bottom coil elements. The elements mentioned above that are not included in FIGS. 1A–1B will be described in more detail in FIGS. 2A–J.

As is shown, the coil is fabricated partially inside a cavity formed in the IC substrate and partially within BEOL wiring levels. In this way, a truly three-dimensional structure can be fabricated, which is nevertheless contained with the thickness boundary of an otherwise standard IC chip. It is also noted that the coils of the present invention have a large diameter cross-section (on the order of about 25 to 35 microns); therefore the coils can be made with a large inductance value and yet occupy a small area of the chip.

The processing steps used in the present invention in fabricating the structure shown in FIGS. 1A and 1B will now be described in more detail by referring to FIGS. 2A–J as well as the description that follows hereinbelow.

Figure 1B:
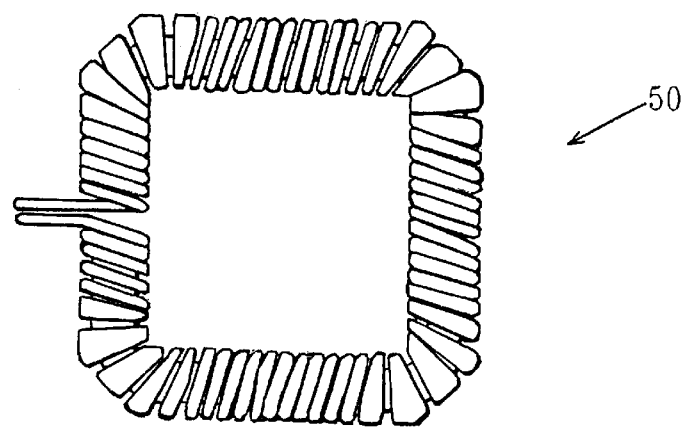
FIG. 1B shows a top-view of the solenoidal coil shown in FIG. 1A. A toroidal coil is a special case of the more general solenoidal shape in which a solenoid is bent back upon itself. This configuration ideally confines all of the magnetic field in the cross-sectional area of the toroid.
Figure 2A:
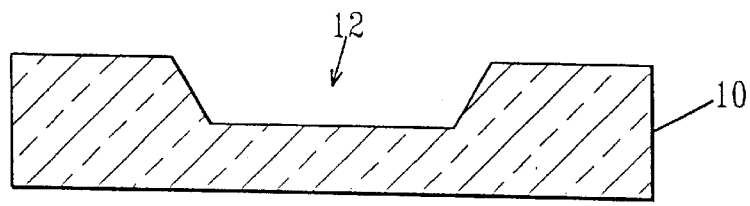
FIGS. 2A–2J show cross-sections of an IC wafer at different stages of fabrication of the solenoidal coil of the present invention.

Specifically, FIG. 2A shows an initial structure that is employed in the present invention in forming the inventive structure illustrated in FIGS. 1A–B. The initial structure includes substrate 10 of an integrated circuit chip having cavities 12 (only one of which is shown in these drawings) formed partially therein. Note the cavities are formed after all the front-end-of-the-line (FEOL) processing of the IC chip is completed, and a passivating layer (not shown in the drawings) of oxide or boron phosphorous-doped silicate glass (BPSG) is deposited on the wafer. This passivating layer is not shown herein since it is locally removed in the region illustrated.

The structure shown in FIG. 2A includes conventional materials well known to those skilled in the art, and conventional processes are employed in fabricating the same. For example, substrate 10 comprises any semiconducting material including, but not limited to: Si, Ge, SiGe, GaAs, InP, InAs and other-like III/V compound semiconductors. Substrate 10 may also be a layered semiconductor such as Si/SiGe or Si/Si as well as a silicon-on-insulator (SOI). The substrate may contain various active device regions either formed therein or formed on a surface of the substrate opposite to that of cavities 12.

Cavities 12 are formed utilizing conventional lithography (including applying a photoresist to a surface of the substrate, exposing the photoresist to a pattern of radiation and developing the pattern) and etching. The etching step includes a dry etching process such as reactive-ion etching (RIE), ion beam etching or plasma etching or a chemical wet etch process that includes a chemical etchant that is highly selective towards the substrate material. In accordance with the present invention, cavities 12 are deep cavities whose depth from the upper surface is from about 10 to about 50 microns, with a depth of from about 20 to about 25 microns being more highly preferred.

Figure 2B:
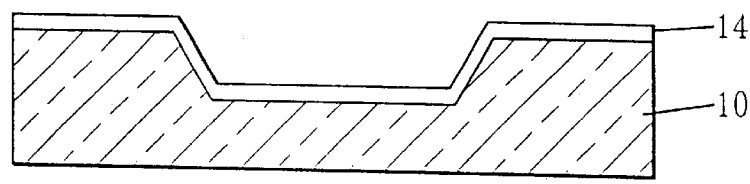

Next, first dielectric material 14 is deposited over the structure shown in FIG. 2A including the top surface of substrate 10 and in cavities 12 so as to provide the structure illustrated in FIG. 2B. The first dielectric material, which may be composed of an oxide such as $SiO_2$; nitride such as $Si_3N_4$; or polyimide, is formed utilizing any conventional blanket deposition process which is capable of forming a conformal layer of first dielectric material 14 on the structure. For example, first dielectric material 14 may be deposited by chemical vapor deposition (CVD), plasma-assisted CVD, sputtering and other like blanket deposition processes. The thickness of the first dielectric material may vary depending upon the type of blanket deposition process and dielectric material employed. Typically, however, the first dielectric material has a thickness of from about 1 to about 10 microns, with a thickness of from about 4 to about 5 microns being more highly preferred.

Figure 2C:
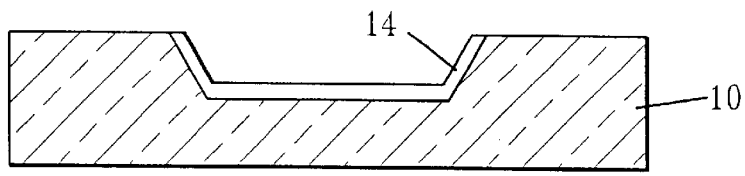
Figure 2D:
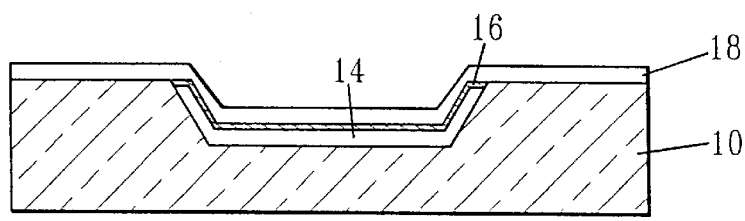

Next, any first dielectric material that is outside cavity 12 is removed from the structure providing the structure shown in FIG. 2C. Note, that after this removal step the cavity in the substrate is lined with first dielectric material 14. The removal step of the present invention, which results in formation of cavities that are lined with first dielectric material 14, is performed utilizing conventional planarization processes such as chemical-mechanical polishing (CMP) or grinding.

A blanket liner (e.g., TaN/Ta, TiN, WN or other like diffusion barrier material) and seed layer (e.g., Cu, Al, W, or other like conductive material) to be used for deposition of the coil material is deposited, followed by a very thick photoresist. It is noted that in FIG. 2D reference numeral 16 refers to both the blanket liner and seed layer, whereas reference numeral 18 refers to the photoresist.

Figure 2E:
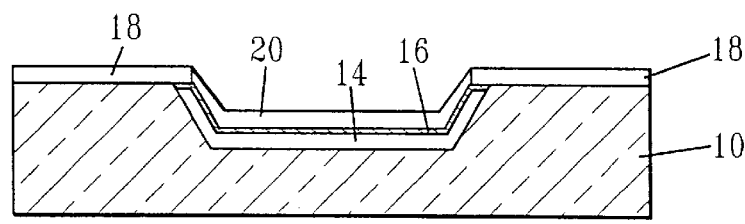

FIG. 2E shows the structure after photoresist 18 is patterned by 1-line, x-ray, and etc. irradiation with a large depth of focus. Note that in FIG. 2E, reference numeral 20 denotes the areas of the photoresist that will be developed using a conventional photoresist developer providing the area for subsequent formation of the coil elements.

In the case of a wet etched cavity, this pattern consists of the bottom elements of the coil, as well as the part of the side (rising) segments, up to, or slightly above, the level of the wafer surface (i.e., the top of the cavity). For cavities with vertical sides, such as obtained by RIE, the pattern on this mask consists only of the bottom elements of the coil; fabrication of the rising elements of coil, up to the wafer surface, requires a second lithography step (using another mask consisting only of "vias"). Note the remaining drawings show this second lithography step, which may be omitted in some embodiments.

After appropriate cleaning of the developed areas, coil element 22 are formed using standard techniques including, but not limited to: electrodeposition, sputtering and plating. The bottom coil elements are composed of a conventional conductive material such as Cu, Al, W and other like conductors. The resultant structure containing bottom coil elements 22 is shown, for example, in FIG. 2F. Note that in this figure bottom coil elements 22 includes portions of liner/seed layer 16.

Figure 2F:
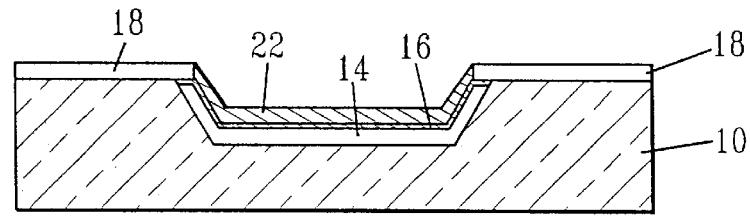
Figure 2G:
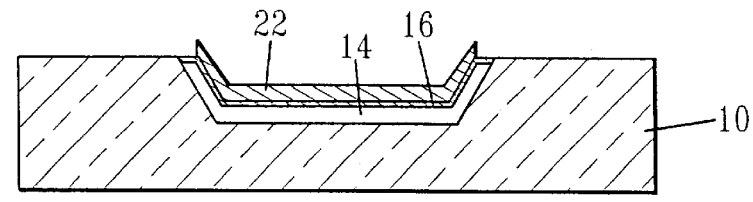
Figure 2H:
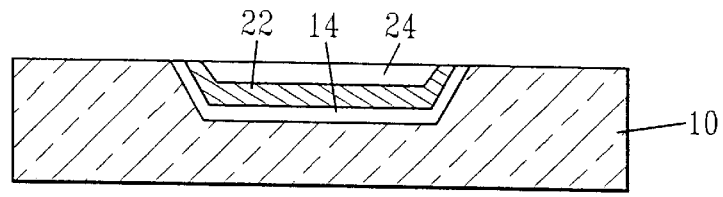

The remaining photoresist 18 is then stripped from structure shown in FIG. 2F utilizing conventional processes well known in the art, and any liner/seed layer 16 not containing bottom coil elements 22 is removed from the structure utilizing a conventional etching process such as RIE. These two processing steps are illustrated in FIG. 2G.

Second dielectric material 24 is then formed over the structure utilizing one of the above-mentioned deposition processes that is employed in forming first dielectric material 14. Second dielectric material 24 may be composed of the same or different dielectric as first dielectric material 14. In a preferred embodiment of the present invention, the first and second dielectric materials are composed of the same dielectric. Following deposition of second dielectric material 24, the structure is subjected to a conventional planarization process such as CMP providing the structure shown in FIG. 2H. Note that during the planarization process some of bottom coil element 22 that is above the top surface of cavity 12 may also be removed.

Figure 2I:
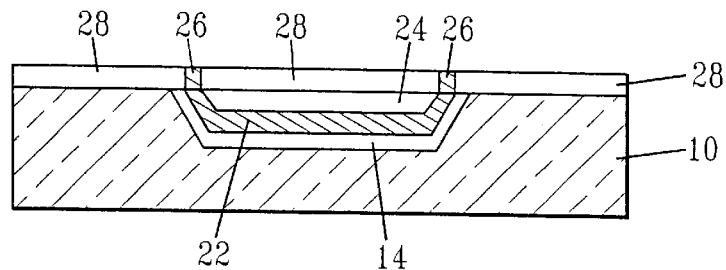
Figure 2J:
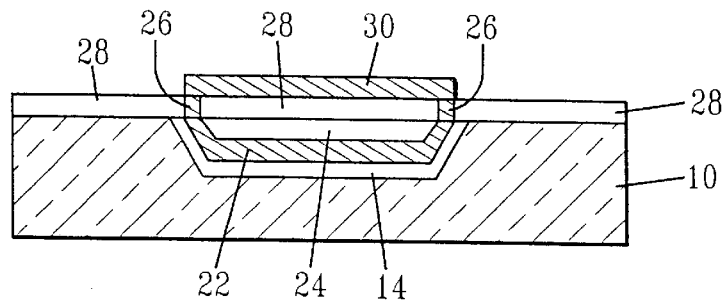

Completion of the missing part of the rising elements (i.e., side coil elements 26) is accomplished as part of the BEOL fabrication of the chip by standard processes such as damascene or dual damascene, FIG. 2I. This includes deposition of dielectric 28, patterning dielectric 28 by conventional lithography and etching so as to form openings in dielectric 28 which exposed bottom coil element 22, and deposition of a conductive metal in the openings. Note that the side coil elements are preferably composed of the same conductive material as the bottom coil element. It is again emphasized that the formation of side coil elements may have been performed earlier; therefore the lithography and etching of the openings and subsequent filling the openings with a conductive material may be omitted.

The horizontal elements (i.e., top coil element 30) that complete the coil loops are fabricated either as part of the BEOL layers, or on top of the BEOL by electrodeposition, sputtering or plating a conductive material (same or different as the bottom and side coil elements, preferably the same conductive material as both the bottom and side coil elements) through a mask (not shown). The resultant structure is shown, for example, in FIG. 2J.

Figure 3:
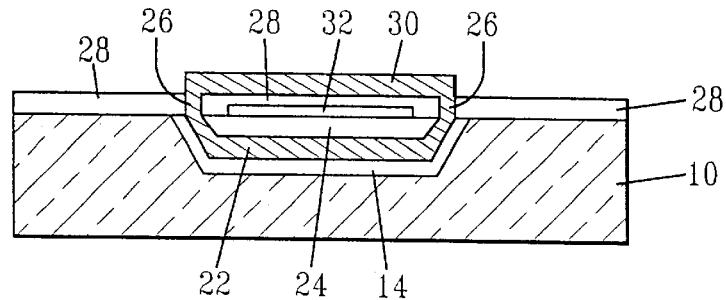
FIG. 3 shows a cross-section of a solenoidal coil with a magnetic core fabricated inside it.

In one embodiment of the present invention, the solenoidal coil is in the shape of a toroid. In another embodiment of the present invention, a core of magnetic material 32 such as PERMALLOY® (i.e. a Ni/Fe alloy) and AlNiCo may be incorporated at a suitable position in the middle of the coil, See FIG. 3. Specifically, magnetic material 32 is formed in the structure utilizing a conventional deposition process such as CVD, plasma-assisted CVD, sputtering, plating or chemical solution deposition.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A method of fabricating a semiconductor structure comprising the steps of:

(a) forming one or more cavities in a substrate of an integrated circuit (IC) chip;

(b) forming a first dielectric material over said substrate including in said one or more cavities;

(c) removing said first dielectric material abutting said one or more cavities, while leaving said first dielectric material in said one or more cavities as a liner;

(d) forming a bottom coil element of a solenoidal coil in said one or more dielectric lined cavities;

(e) forming a second dielectric material over said substrate including said bottom coil element of said solenoidal coil;

(f) removing said second dielectric material over said substrate not containing said one or more cavities; and (g) forming side coil elements and a top coil element of said solenoidal coil, wherein said top coil element is in electrical contact with said bottom coil element through said side coil elements.

2. The method of claim 1 wherein said one or more cavities are formed by lithography and etching.

3. The method of claim 1 wherein said substrate includes a passivating layer formed thereon.

4. The method of claim 1 wherein said first dielectric has a thickness of from about 1 to about 10 microns.

5. The method of claim 4 wherein said first dielectric has a thickness of from about 4 to about 5 microns.

6. The method of claim 1 wherein said first dielectric material is formed by a blanket deposition process.

7. The method of claim 1 wherein step (c) is carried out by a planarization process.

8. The method of claim 7 wherein said planarization process is chemical-mechanical polishing.

9. The method of claim 1 wherein said bottom coil element is formed by the steps of: forming a liner/seed layer on said first dielectric material; forming a patterned photoresist on said substrate wherein said patterned photoresist does not cover portions of said liner/seed layer in said cavity; and depositing a conductive material onto said liner/seed layer.

10. The method of claim 9 wherein said conductive material is deposited by an electrodeposition process.

11. The method of claim 1 wherein said second dielectric material is formed by deposition.

12. The method of claim 1 wherein step (f) includes a planarization process.

13. The method of claim 12 wherein said planarization process is chemical-mechanical polishing.

14. The method of claim 1 wherein said side coil elements are formed by damascene or dual damascene processes.

15. The method of claim 1 wherein said side coil elements are formed by the steps of: forming a dielectric over said substrate including said second dielectric material; providing openings in said dielectric exposing portions of said bottom coil element; and filling said openings with a conductive material.

16. The method of claim 1 wherein said top coil element is formed by deposition of a conductive material through a patterned mask.

17. The method of claim 16 wherein said deposition comprises electrodeposition.

18. The method of claim 1 wherein side coil elements are also formed in step (d) and step (g) only includes formation of said top coil element.

* * * * *